United States Patent
Bainvoll

[11] Patent Number: 6,075,412
[45] Date of Patent: Jun. 13, 2000

[54] LINEARIZATION FOR POWER AMPLIFIERS

[75] Inventor: Efraim Bainvoll, Los Angeles, Calif.

[73] Assignee: Ophir RF, Inc., Los Angeles, Calif.

[21] Appl. No.: 09/170,983

[22] Filed: Oct. 13, 1998

[51] Int. Cl.[7] ............................................. H03F 1/26
[52] U.S. Cl. ............................ 330/149; 455/63; 375/297
[58] Field of Search ........................... 330/149; 375/296, 375/297; 455/63

[56] References Cited

U.S. PATENT DOCUMENTS

| | | | |
|---|---|---|---|
| 4,987,378 | 1/1991 | Eggleston et al. | 330/149 |
| 5,748,678 | 5/1998 | Valentine et al. | 375/297 |
| 5,909,642 | 6/1999 | Suzuki | 455/114 |
| 5,917,375 | 6/1999 | Lisco et al. | 330/151 |
| 5,949,283 | 9/1999 | Proctor et al. | 330/149 |

*Primary Examiner*—Robert Pascal
*Assistant Examiner*—Henry Choe
*Attorney, Agent, or Firm*—Blakely, Sokoloff, Taylor & Zafman LLP

[57] ABSTRACT

The present invention is a method and apparatus for linearizing a non-linear portion of a first response of a power amplifier in response to an input signal over an operating range. A linearizing module preprocesses the input signal. The linearizing module provides a second response which is complementary to the first response in the non-linear portion of the first response. The power amplifier processes the preprocessed input signal to generate a result response which is linear over the operating range.

8 Claims, 3 Drawing Sheets

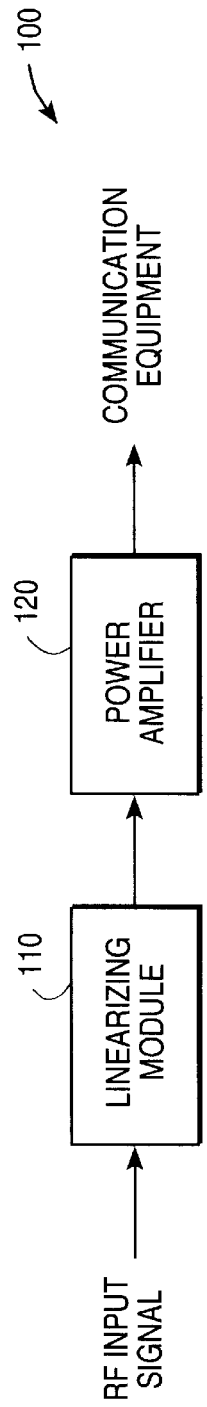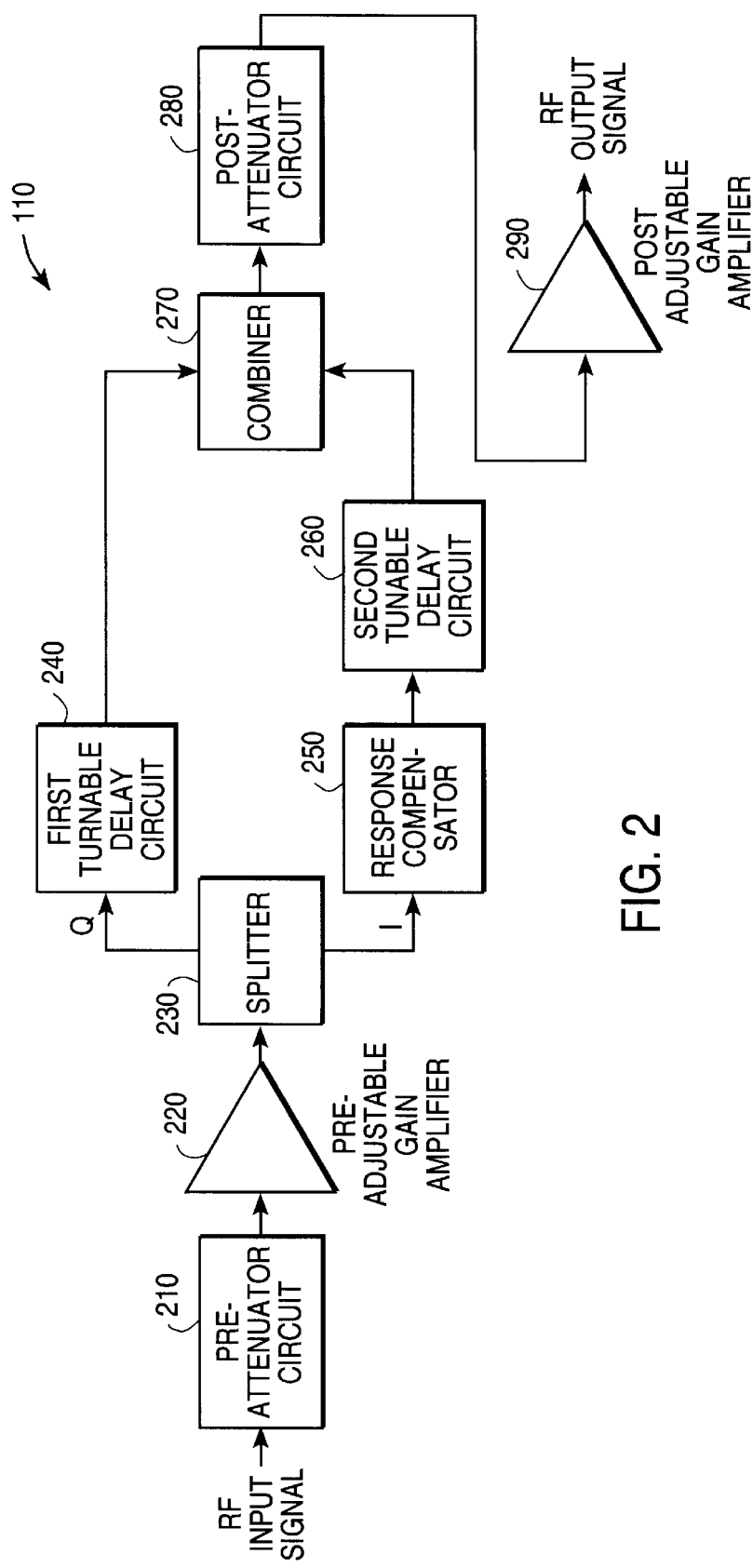

LINEARIZATION FOR POWER AMPLIFIERS

BACKGROUND OF THE INVENTION

1. Field of the Invention

This invention relates to microwave devices. In particular, his invention relates to power amplifiers.

2. Description of Related Art

Radio frequency (RF) high power amplifiers (HPA) are used in any applications such as radio frequency interference (RFI), electromagnetic interference (EMI) testing, lab equipment, communication, television broadcasting, land mobile communications, wireless communication services. These HPA usually have a frequency range between a few hundred MHz to several GHz with output power at several watts to several hundred watts. The desirable features of the HPA include high linearity, wide frequency range, low distortion and low noise figure.

Maintaining linearity of the HPA responses over the operating power range is a difficult problem. Not only the amplitude, or power gain, response needs to be linear, but the phase response should also be linear over the entire power range. Although at low power, the linearity for amplitude and phase can be achieved, as power increases, the amplitude and phase responses tend to be distorted, resulting in nonlinear characteristics.

Accordingly, there is a need in the technology to provide an efficient technique to linearize the amplitude and phase responses for high power amplifiers over the operating power range.

SUMMARY OF THE INVENTION

The present invention is a method and apparatus for linearizing a non-linear portion of a first response of a power amplifier in response to an input signal over an operating range. A linearizing module preprocesses the input signal. The linearizing module provides a second response which is complementary to the first response in the non-linear portion of the first response. The power amplifier processes the preprocessed input signal to generate a result response which is linear over the operating range.

BRIEF DESCRIPTION OF THE DRAWINGS

The objects, features and advantages of the present invention will become apparent from the following detailed description of the present invention in which:

FIG. 1 is a diagram illustrating a system in which one embodiment of the invention can be practiced.

FIG. 2 is a diagram illustrating a linearizing module according to one embodiment of the present invention.

DESCRIPTION OF THE PRESENT INVENTION

Figure 3:
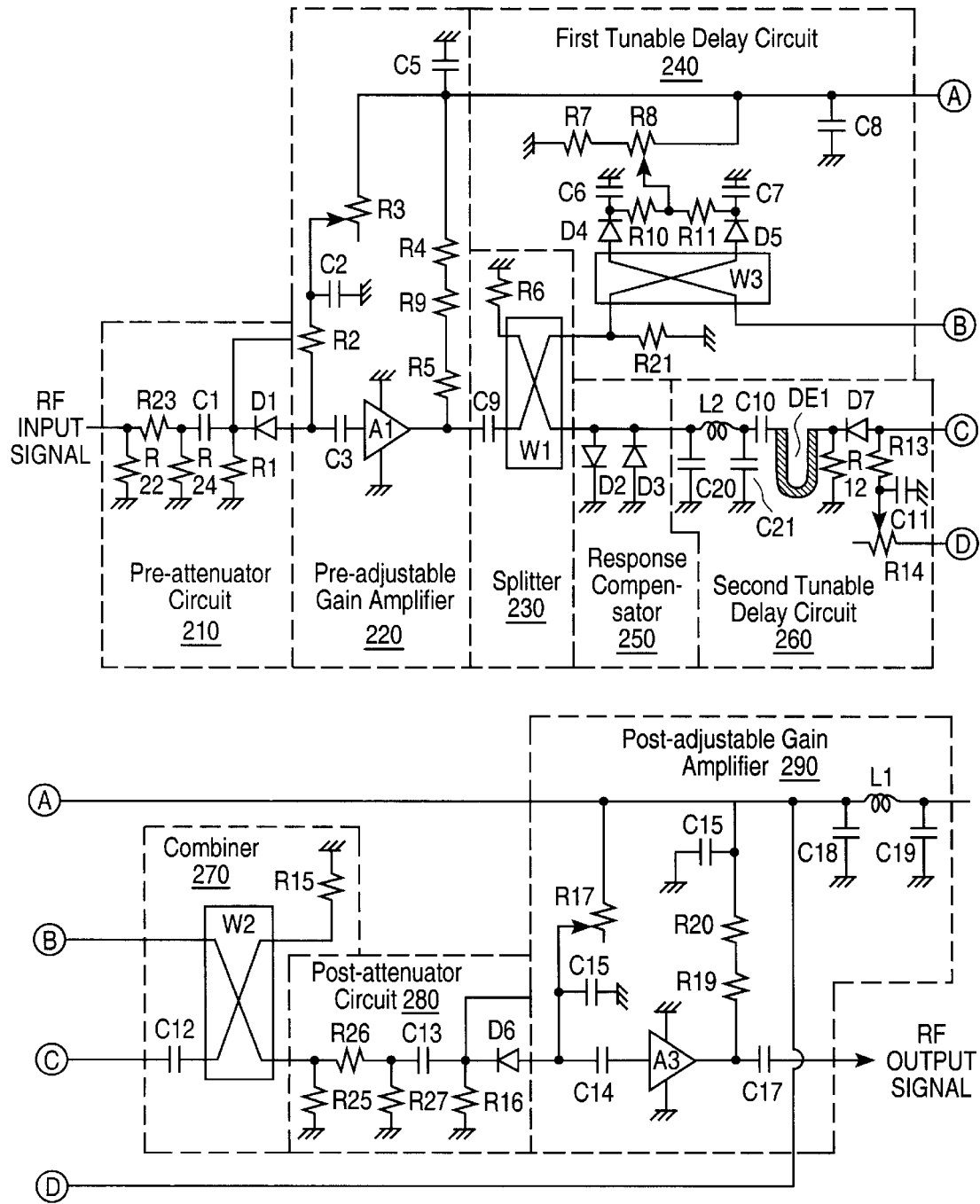
FIG. 3 is a diagram illustrating a detailed linearizing module according to one embodiment of the present invention.

The present invention is a technique to linearize the amplitude and phase responses of high power amplifiers (HPAs). A linearizing module is coupled to the HPA. The linearizing module includes a tunable delay and barrier Schottky diodes which provide a characteristic complementary to the non-linear portion of the HPA characteristics. The combined responses of the linearizing module and the HPA are linear over the operating power range.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention.

FIG. 1 is a diagram illustrating a system in which one embodiment of the invention can be practiced. The system 100 includes a linearizing module 110 and a high power amplifier (HPA) 120. The linearizing module 110 preprocesses the RF input signal by providing a linearizing response to the amplitude and phase. The HPA processes the preprocessed RF input signal to generate a result response which is the sum of the linearizing response and the HPA response. The result response becomes linear over the operating range as a result of the canceling effect of the two responses in the non-linear portion of the responses.

The linearizing module 110 receives the radio frequency (RF) input signal and provides complementary responses to the HPA 120. The linearizing module 110 is adjustable to accommodate a wide variety of amplitude and phase responses of the HPA 120. In one embodiment, the RF input signal has an operating frequency range as low as a few megahertz (MHz) to as high as several gigahertz (GHz). The typical frequency range is several hundred MHz up to 3 GHz. The RF input signal has a typical power of a few milliwatts (mW).

The HPA is any HPA operating in a wide frequency band and providing high power output. Typically the frequency range of the HPA is compatible with the frequency range of the linearizing module 110. The output power range of the HPA is between a few tens of watts to a few hundred watts. The typical output power is 1 W to 500 W. The power gain of the HPA is between about 30 dB to 60 dB. The HPA provides high power RF output signal to drive RF devices. Examples of RF devices driven by the HPA include EMI, RFI circuits and equipment, communication devices, and satellite uplink components.

FIG. 2 is a diagram illustrating a linearizing module according to one embodiment of the present invention. The linearizing module 110 includes a first attenuator circuit 210, a first adjustable gain amplifier 220, a splitter 230, a first tunable delay circuit 240, a response compensator 250, a second tunable delay circuit 260, a combiner 270, a second attenuator circuit 280, and a second adjustable gain amplifier 290.

The first attenuator circuit 210 receives the RF input signal and provides signal conditioning to the received RF signal. The first adjustable gain amplifier 220 provides gain to the conditioned signal to compensate for loss. The gain is adjustable to accommodate a wide range of input signal level. The splitter 230 separates the amplified signal into two components, an in-phase (I) component and a quadrature (Q) component. The I and Q components are separated by a 90-degree phase shift.

The first tunable delay circuit 240 is coupled to either the I or the Q component output of the splitter 230 and provides an adjustable delay. In one embodiment, the first tunable delay circuit 240 is coupled to the Q component. The response compensator 250 is coupled to the other component output of the splitter 230 and provides compensating characteristic to the amplitude and phase responses of the HPA 120 (FIG. 1). In one embodiment, the response compensator 250 is coupled to the I component and is implemented by a diode pair consisting of two diodes arranged in opposite directions. The second tunable delay circuit 260 is coupled between the response compensator 250 and the combiner 270 to provide suitable delay on the I component.

The combiner 270 receives the delayed I and Q components and combines into a composite signal. The second attenuator circuit 280 provides additional compensating and matching function. The second adjustable gain amplifier 290 provides amplitude adjustment to the combined signal to match with the response of the HPA. The output of the second adjustable gain amplifier 290 is an RF output signal to go to the input of the HPA.

FIG. 3 is a diagram illustrating a detailed linearizing module according to one embodiment of the present invention. The linearizing module 110 includes various RF components forming functional circuits as shown in FIG. 3. As is known by one skilled in the art, variations to the detailed circuits are possible.

The first attenuator circuit 210 includes resistors R1, R22, R23, and R24, capacitor C1, and diode D1. Resistors R1, R22, R23, and R24, and capacitor C1 form an attenuator and matching circuit. Diode D1 is a PIN diode for gain adjustment. In one embodiment, the diode D1 is manufactured by Hewlett-Packard with part number HSMP-4810. The HSMP-4810 is a low distortion attenuating PIN designed for operation up to 3 GHz.

The first diode and gain amplifier 220 provides gain control to the RF input signal and additional filtering. The bias network including resistors R5, R9, R4, R2 and potentiometer R3 provides gain adjustment via PIN diode. The amplifier A1 provides amplification to the input signal. In one embodiment, the amplifier A1 is manufactured by Mini-Circuits with part number ERA-5SM.

The splitter 230 includes a capacitor C9, a resistor R6 and a 90° coupler W1. The capacitor C9 provides coupling between the amplifier A1 and the 90° coupler W1. The resistor R6 provides the 50-Ohm terminating resistance. The 90° coupler W1 splits the signal into two components: the in-phase (I) component and the quadrature (Q) component by shifting the phase of the input signal by a 90-degree phase shift. In one embodiment, the 90° coupler W1 is manufactured by Murata with part number LDC30B030GC2 or LDC20B030F1600/1850 which can cover a frequency range from 200 MHz to 2.7 GHz.

The first tunable delay circuit 240 includes resistors R21, R10, R11. R7 and potentiometer R8, capacitors C6, C7, two diodes D4 and D5, and a 90° coupler W3. Resistor R21 is a terminating resistor for the 90° coupler W3. In one embodiment, the 90° coupler W3 is manufactured by Murata with part number LDC30B030GC2 or LDC20B030F1600/1850 which can cover a frequency range from 200 MHz to 2.7 GHz. The resistor network R10, Rh11, R7 and potentiometer R8 provides a mechanism to tune or adjust the delay of the quadrature component. Diodes D4 and D5 provide continuous capacitor control for adjustable delay. In one embodiment, the diodes D4 and D5 are tuning varactor diodes manufactured by Metelics Corporation with part number SMTD3002. By varying the potentiometer R8, the first tunable delay circuit 240 can provide suitable effect on the magnitude and phase responses of the HPA 120 (in FIG. 1).

The response compensator 250 provides the linearizing effect on the amplitude and phase responses. The response compensator 250 includes diodes D1 and D2 connected in opposite directions. In one embodiment, the diodes D1 and D2 are medium barrier Schottky diodes manufactured by Metelics Corporation with part number MSS40-255-E30.

The second tunable delay circuit 260 includes capacitors C20, C21, C10, C11, resistors R12, R13 and potentiometer R14, inductor L2, diode D7 and delay element DE 1. The capacitors C20, C21, C10 and inductor L2 and delay element DE1 provide a fixed delay and additional filtering. The diode D7 provides attenuation function. The resistors R13, potentiometer R14, and capacitor C11 provide additional control for delaying the signal. In one embodiment, the diode D7 is a PIN diode manufactured by Hewlett Packard with part number HSMP-4810.

The combiner 270 includes a capacitor C12, a 90° coupler W2, and a resistor R15. The capacitor C12 provides coupling to the delayed signal. The 90° coupler W2 combines the I and Q components. The resistor R15 provides a 50-Ohm terminating resistance to the 90° coupler W2. In one embodiment, the 90° coupler W2 is manufactured by Murata with part number LDC30B030GC2 or LDC20B030F1600/1850 which can cover a frequency range from 200 MHz to 2.7 GHz.

The second adjustable attenuator circuit 280 includes resistors R16, R25, R26, and R27, capacitor C13, and diode D6. Resistors R16, R25, R26, and R27, and capacitor C13 form a filter and matching circuit. Diode D6 is a PIN diode for attenuation effect. In one embodiment, the diode D6 is manufactured by Hewlett-Packard with part number HSMP-4810. The HSMP-4810 is a low distortion attenuating PIN designed for operation up to 3 GHz.

The second adjustable gain amplifier 290 provides gain control to the RF signal and additional filtering. The bias network including resistors R18, R19, R20, and potentiometer R17 provides gain adjustment. The amplifier A3 provides amplification to the attenuated signal. In one embodiment, the amplifier A3 is manufactured by Mini-Circuits with part number ERA-5SM. The inductor L1 and capacitors C18 and C19 provide additional filtering.

Figure 4A:
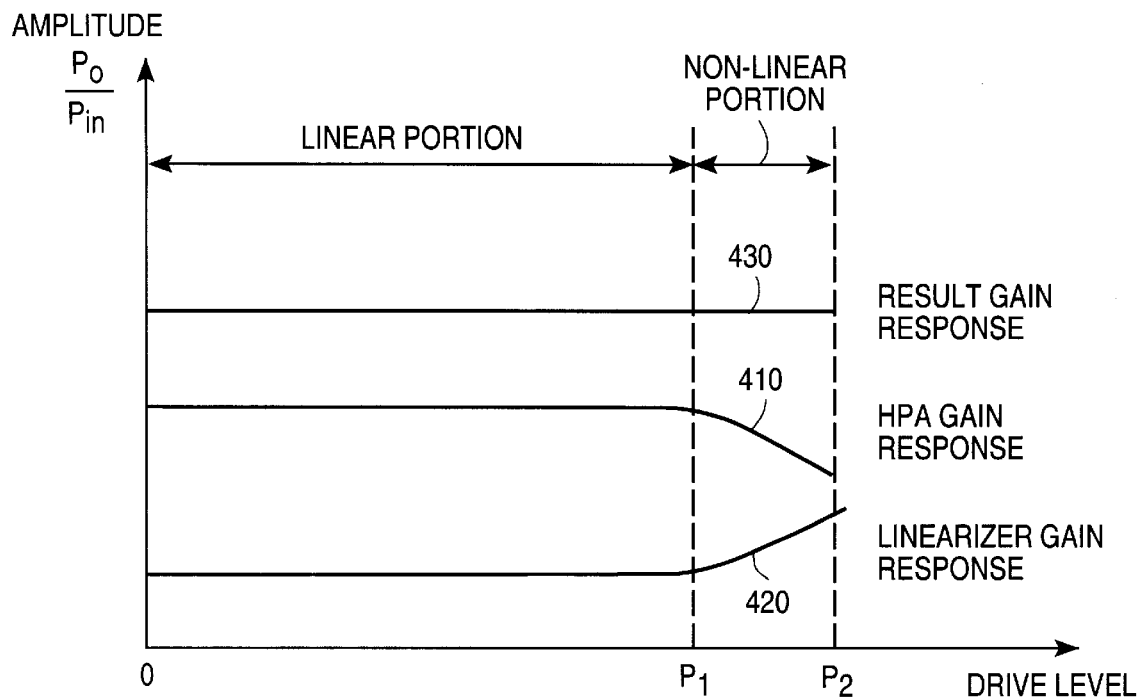
FIGS. 4A and 4B are diagrams illustrating amplitude and phase responses respectively according to one embodiment of the present invention.

FIG. 4A is a diagram illustrating amplitude (gain) responses according to one embodiment of the present invention. The responses include a HPA gain response 410, a linearizer gain response 420, and a result gain response 430.

The HPA gain response 410 shows the amplitude gain response of the HPA without the linearization. The vertical axis is the response of the HPA. The response for the amplitude is the ratio between the output power and the input power. A flat or straight response indicates that the output follows the input in a linear fashion. The horizontal axis is the drive level, or the power level. The HPA response exhibits a linear behavior from low to a power level of P1, then the response becomes non-linear with some degradation from the power level P1 to P2.

The linearizer gain response 420 shows the amplitude gain response of the linearizing module. The linearizer gain response 420 exhibits a linear behavior from low to a power level of P1, then the response becomes non-linear with the curve going upward between the power level of P1 to P2. Note that the non-linear portion is complementary to the portion in the HPA gain response 410.

The result gain response 430 is the sum of the two responses 410 and 420. From low up to the drive level of P1, the sum of the two linear responses is another linear response. From the drive level P1 to P2, the sum of the two complementary responses is a straight line. The non-linear effects of the HPA and the linearizing module cancel each other such that the resulting response is linear. It is therefore seen that the linearizing module in fact linearizes the HPA amplitude gain response over the entire operating power levels.

Figure 4B:
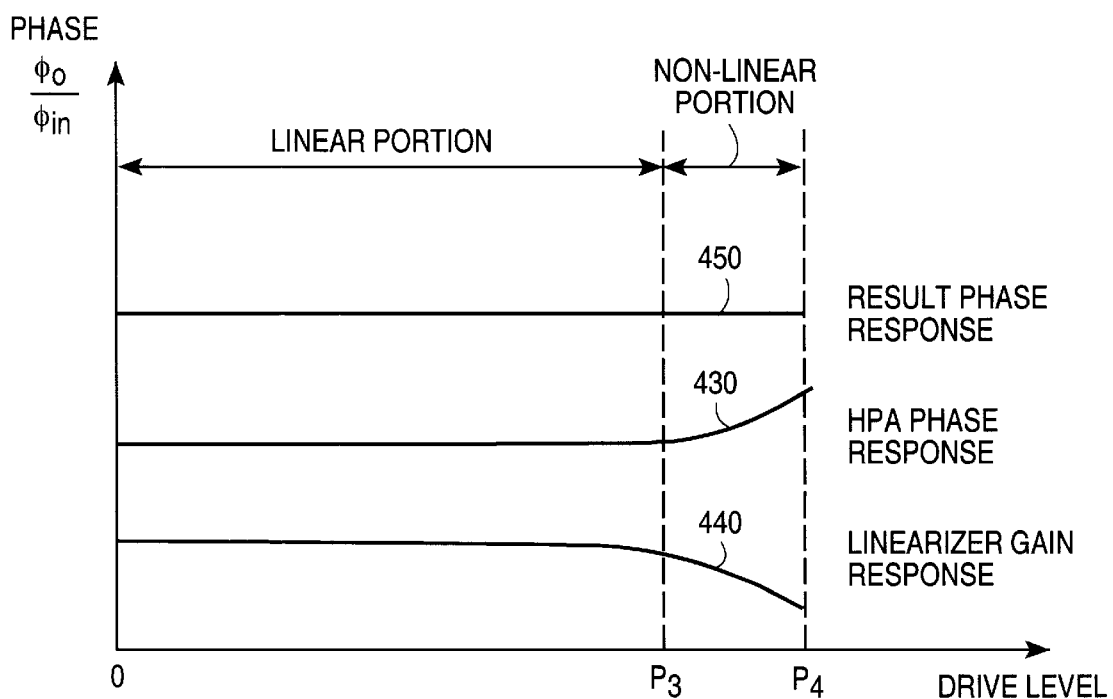

FIG. 4B is a diagram illustrating phase responses according to one embodiment of the present invention. The responses include a HPA phase response 430, a linearizer phase response 440, and a result phase response 450.

The HPA phase response 440 shows the phase response of the HPA without the linearization. The vertical axis is the response of the HPA. The response for the phase is the ratio between the output phase and the input phase. A flat or straight response indicates that the output follows the input in a linear fashion. The horizontal axis is the drive level, or the power level. The HPA phase response exhibits a linear behavior from low to a power level of P3, then the response becomes non-linear with upward curvature from the power level P3 to P4.

The linearizer phase response 440 shows the phase response of the linearizing module. The linearizer phase response 440 exhibits a linear behavior from low to a power level of P3, then the response becomes non-linear with the curve going downward between the power level of P3 to P4. Note that the non-linear portion is complementary to the portion in the HPA phase response 430.

The result phase response 450 is the sum of the two responses 430 and 440. From low up to the drive level of P3, the sum of the two linear responses is another linear response. From the drive level P3 to P4, the sum of the two complementary responses is a straight line. The non-linear effects of the HPA and the linearizing module cancel each other such that the resulting response is linear. It is therefore seen that the linearizing module in fact linearizes the HPA phase response over the entire operating power levels.

Thus, the present invention provides a technique to linearize the amplitude and phase responses of high power amplifiers over the entire operating range. The technique uses a tunable linearizing module to process the RF input signal before going to the HPA. The linearizing module provides amplitude and phase responses that are complementary to the HPA responses in the non-linear portions. The non-linear portions of the linearizing module and the HPA cancel each other, resulting in linear responses.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method for linearizing a non-linear portion of a first response of a power amplifier in response to an input signal over an operating range, the method comprising:
   preprocessing the input signal by a linearizing module, the linearizing module providing a second response complementary to the first response in the non-linear portion of the first response, the preprocessing comprises:
      splitting the input signal into first and second components, the first and second components being phase shifted by a predetermined phase amount,
      delaying the first component by a first adjustable delay,
      compensating the second component by a response compensator, and
      combining the delayed first component and the compensated second component to generate a combined signal; and
   processing the preprocessed input signal by the power amplifier to generate a result response, the result response being linear over the operating range.

2. The method of claim 1 further comprising:
   providing a first gain to the input signal before the splitting; and
   providing a second gain to the combined signal.

3. The method of claim 2 further comprising:
   delaying the compensated second component by a second adjustable delay.

4. The method of claim 3 further comprising:
   attenuating the input signal before providing the first gain; and
   attenuating the combined signal before providing the second gain.

5. An apparatus for linearizing a non-linear portion of a first response of a power amplifier in response to an input signal over an operating range, the apparatus comprising:
   a linearizing module coupled to the power amplifier, the linearizing module providing a second response complementary to the first response in the non-linear portion of the first response, the linearizing module comprises:
      a splitter to split the input signal into first and second components, the first and second components being phase shifted by a predetermined phase amount,
      a first adjustable delay element coupled to the splitter to delay the first component,
      a response compensator coupled to the splitter to compensate the second component, and
      a combiner coupled to the first adjustable delay element and the response compensator to combine the delayed first component and the compensated second component to generate a combined signal; and
   wherein the power amplifier processes the preprocessed input signal to generate a result response, the result response being linear over the operating range.

6. The apparatus of claim 5 further comprising:
   a first gain amplifier coupled to the splitter to provide a first gain to the input signal before the splitter; and
   a second gain amplifier coupled to the combiner to provide a second gain to the combined signal.

7. The apparatus of claim 6 further comprising:
   a second adjustable delay element coupled to the response compensator to delay the compensated second component by a second adjustable delay.

8. The apparatus of claim 7 further comprising:
   a first attenuator coupled to receive the input signal and to filter the input signal prior to the first gain amplifier; and
   a second attenuator coupled to the combiner to filter the combined signal prior to the second gain amplifier.

* * * * *